United States Patent [19]

Braun et al.

[11] 4,279,669
[45] Jul. 21, 1981

[54] METHOD FOR EPITAXIAL DEPOSITION

[75] Inventors: Peter D. Braun, Obersulm-Eschenau; Wolodymyr Kosak, Biberach, both of Fed. Rep. of Germany

[73] Assignee: Licentia Patent-Verwaltungs-G.m.b.H., Frankfurt am Main, Fed. Rep. of Germany

[21] Appl. No.: 52,394

[22] Filed: Jun. 27, 1979

[30] Foreign Application Priority Data

Jul. 7, 1978 [DE] Fed. Rep. of Germany ....... 2829830

[51] Int. Cl.³ .......................................... H01L 21/20
[52] U.S. Cl. .................................. 148/175; 156/612; 156/613; 156/614; 427/86
[58] Field of Search ...................... 156/612, 613, 614; 148/175; 427/86

[56] References Cited

U.S. PATENT DOCUMENTS

| | | | |
|---|---|---|---|
| 3,089,788 | 5/1963 | Marinaie | 156/613 |
| 3,316,130 | 4/1967 | Dash et al. | 148/175 |
| 3,345,209 | 10/1967 | Cheroff et al. | 156/613 |
| 3,428,500 | 2/1969 | Maeda | 148/175 |
| 3,493,444 | 2/1970 | Sirtl et al. | 156/613 |
| 3,589,936 | 6/1971 | Tramposch | 156/612 |
| 3,692,572 | 9/1972 | Strehlow | 156/614 |

OTHER PUBLICATIONS

Boss et al., "Epitaxial Crystal Growth", IBM TDB, 5, No. 12, May, 1963.
Nicoll, "The Use of Close Spacing in Chemical-Transport Systems for Growing Epitaxial Layers of Semiconductors", Journal of Electrochemical Soc. 110, No. 11, pp. 1165–1167, Nov. 1963.

*Primary Examiner*—John D. Smith
*Attorney, Agent, or Firm*—Spencer & Kaye

[57] ABSTRACT

A method of epitaxial deposition comprises arranging semi-conductor discs and source material in two spaced planes in a reaction vessel, controlling the temperatures of the source material and the semi-conductor discs separately and introducing a gaseous medium into the reaction vessel to provide an equilibrium condition in which material is moved from the source material and deposited on the semi-conductor discs.

The invention also includes an apparatus suitable for carrying out the method.

5 Claims, 2 Drawing Figures

U.S. Patent  Jul. 21, 1981  4,279,669

METHOD FOR EPITAXIAL DEPOSITION

BACKGROUND OF THE INVENTION

The invention relates to a method and apparatus of epitaxial deposition.

In order to manufacture epitaxially deposited semi-conductor layers on semi-conductor substrate discs, various methods are known. In preferred manner these layers are manufactured by decomposing a reaction gas made up of a semi-conductor compound by means of the semi-conductor discs which are to be coated, whereby monocrystalline semi-conductor material is deposited on the substrate discs. In a known method both source material and the semi-conductor discs to be coated are housed in an evacuated reaction vessel. Thus the substrate discs and the source material are arranged at the remote ends of an elongate tube. The source material and the substrate discs are brought to different temperatures. Then a syringe, containing iodine, for example, is opened inside the reaction vessel so that a partial pressure equilibrium of gaseous and chemical semi-conductor compounds may be formed in the region of the source discs and in the region of the semi-conductor substrate discs. Because of the temperature difference between the two equilibrium systems they come into reciprocal action whereby semi-conductor material is worn away from the source discs and by conversion of the reaction gas in the region of the semi-conductor substrate discs is deposited again. This method is very expensive at the moment since the reaction vessel has to be evacuated and sealed for each epitaxial process. Furthermore, in this method special auxiliary devices are necessary in the sealed system in order to release the reaction gas.

SUMMARY OF THE INVENTION

It is an object of the invention to provide a method of epitaxially depositing semi-conductor material in which the separating process may be very exactly controlled, in which no evacuation of the reaction vessel is necessary which is cheap and which permits coating of a plurality of semi-conductor discs without long preparation times.

According to a first aspect of the invention, there is provided a metod of epitaxial deposition of semi-conductor compounds on semi-conductors comprising arranging the semi-conductor discs and source material one above the other in a reaction vessel, controlling the temperature of said semi-conductor discs and source material separately and differently and introducing a gaseous medium into the reaction vessel to provide an equilibrium condition in which material is removed from the source material and deposited on the semi-conductor discs.

Further, according to this aspect of the invention, there is provided a method of epitaxial deposition on semi-conductor substrate discs by conversion of gaseous semi-conductor compounds said conversion taking place in a transfer space between a material source region and the semi-conductor substrate discs, in which the source material and the semi-conductor substrate discs are arranged in a reaction vessel in two planes one above the other which are at different and separately controllable temperatures, the spacing between these planes is small as compared to the length of the reaction vessel filled with flowing gas and in which, in each case, a partial pressure equilibrium of the gaseous medium is produced in the surroundings around the source material and the substrate discs, whereby the two equilibrium systems come into interaction across the transfer space between the two planes while eroding material from the source and deposition of material on the substrate discs.

According to a second aspect of the invention, there is provided apparatus for epitaxial deposition of semi-conductor compounds on semi-conductor discs comprising a reaction vessel having support means for supporting the source material and semi-conductor discs in different planes, means for controlling the temperatures of the semi-conductor source material and the semi-conductor discs separately and means for introducing a gaseous medium into the reaction vessel to provide an equilibrium condition in which material is removed from the source material and deposited on the semi-conductor discs.

BRIEF DESCRIPTION OF THE DRAWINGS

The method in accordance with the invention and the device suitable for carrying out this method will now be described in greater detail, by way of example, with reference to the drawings, in which.

DESCRIPTION OF THE PREFERRED EMBODIMENT

Figure 1:
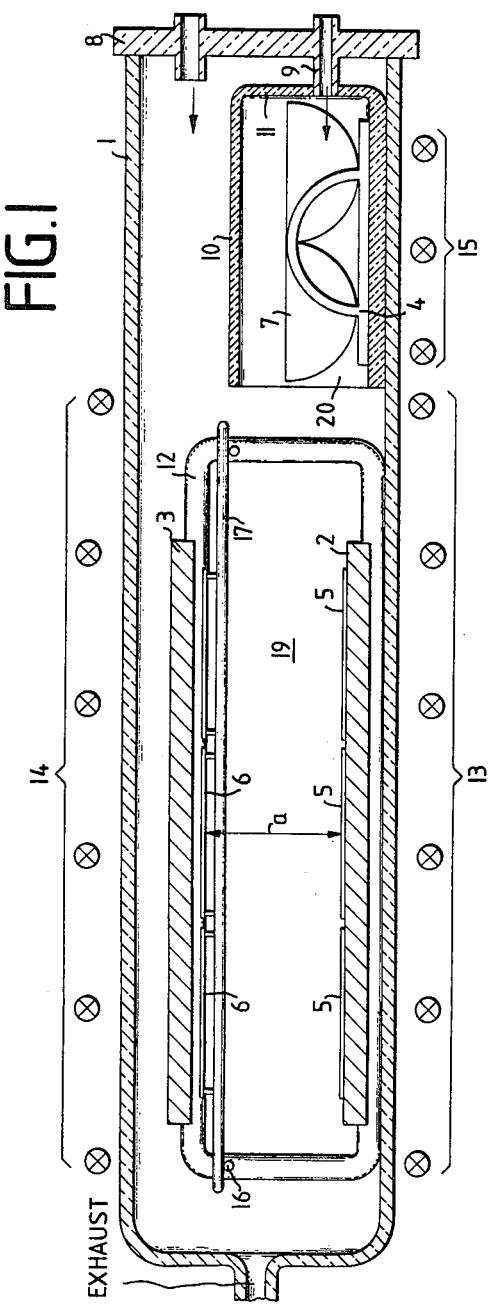
FIG. 1 is a longitudinal section through a reaction vessel.
Figure 2:
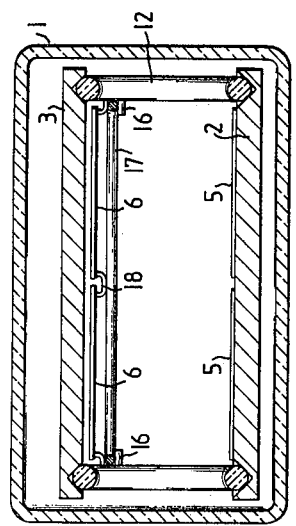
FIG. 2 shows a cross-section through this reaction vessel.

In a reaction tube is arranged preferably a holder for the source material and a holder for semi-conductor substrate discs in two parallel planes one above the other. An initial chamber in the reaction tube is connected in front of the part of the reaction tube accommodating the substrate discs and the source material, this initial chamber having to be passed through by the reaction gas before entry into the transfer space between the source material and the substrate discs and in which semi-conductor source material is also arranged for the purpose of ensuring that the reaction gas has the composition prevailing there on entry into the region of the transfer space.

The spacing between the two planes which limit the region of the transfer space, these planes being equipped on the one hand with the source discs and on the other hand with the semi-conductor substrate discs to be coated, may by changed, insofar as the dimensions of the reaction tube permit, in order to bring about a change in the rate of deposition in this way. The rate of deposition is determined moreover by the temperature of the source material or by the temperature of the semi-conductor substrate discs and by the difference in temperature lying therebetween and by the quantity of the reaction gas supplied.

It is particularly advantageous if the rate of separation or the separating conditions can be changed by several parameters. With the above method, or the related apparatus, optimum utilization of the reaction tube is possible since the source material and the semi-conductor discs to be coated are arranged above each other and not, as conventional behind each other with respect to the longitudinal extent of the reaction tube. The spacing between the source material and the semi-conductor discs to be coated is relatively small with respect to the longitudinal extent of the housings carrying the semi-conductor discs so that, in practice, all of the material worn away from the source material is deposited epitaxially on to the semi-conductor substrate discs. The incorporation of the initial chamber ensures that the same partial pressure ratios prevail in the entire region of the transfer space and thus in all of the semi-conductor discs to be coated and thus the mixture of gas has the same composition in the entire of the transfer space in the direction of the longitudinal extent. The gas is distinguished of course in its composition by the different temperatures in the region of the source material from the composition in the immediate vicinity of the semi-conductor substrate discs. Thus two different equilibrium systems are formed which occur in turn because of the difference in temperature between them in reciprocal action whereby exchange of material takes place.

The above method is particularly suitable for producing monocrystalline silicon semi-conductor layers on monocrystalline silicon substrate discs. Furthermore, in order to produce locally limited semi-conductor regions made from epitaxially separated material, it may be advantageously used on a semi-conductor substrate disc. This partial coating of semi-conductor substrate discs is known as local epitaxy. The epitaxially deposited semi-conductor layers may be doped in different ways. On the other hand, doped source material may be used, whereby doping is produced in the epitaxial layers. There is also the possibility of adding a doping gas to the reaction gas or of mixing both doping methods. A suitable carrier gas may be added moreover to the reaction gas which carrier gas comprises argon or nitrogen for example.

Referring now to the drawings, a reaction tube 1 with a rectangular cross-section is preferably used. This reaction tube 1 is preferably formed of quartz. The reaction tube is not evacuated but is provided at the input point with a closure 8 which contains openings 9 for the reaction gas and possibly for a doping or carrier gas. The reaction vessel tapers at the end and opens finally at the draw-off or exhaust point.

Two holders 2 and 3 which are designated as susceptors, lie in two parallel planes above each other in the reaction tube 1. The two susceptors 2 and 3 are preferably approximately of equal size and lie above each other substantially covering the same area (i.e. totally overlapping). The spacing a between the two susceptors 2 and 3 is small with respect to its longitudinal expanse and runs parallel to the axis of the tube 1. In one embodiment, the spacing a is approximately 2 to 6 cm while the susceptors may be 30 to 100 cm long. The susceptor 2 lying at the bottom serves to accommodate the semi-conductor source material. This source material may be applied to the holder 2 for example in the form of discs 5. There is also the possibility of coating the entire susceptor surface thickly with the source material since this source material may be used again and again for a plurality of deposition processes until it is finally used up. The susceptor 3 lying at the top serves to absorb or transfer heat from the semi-conductor substrate discs 6 which are to be coated. In a suitable example the two susceptors 2 and 3 are fixed to a carrier frame 12. A guide 16 for a coating boat 17 which accommodates the semi-conductor discs may be fixed to the perpendicular columns or plates of the carrier frame 12. This coating boat 17 preferably comprises a frame into recesses of which are placed the semi-conductor discs 6. Thus the semi-conductor discs do not fall out of the frame and small bearing surfaces 18 are provided on the frame of the coating boat 17 which surfaces 18 support the edge of the semi-conductor discs 6. The semi-conductor discs 6 are thus suspended in the coating boat and are heated to the required temperature by the susceptor 3 arranged thereabove. The coating boat 17 is arranged preferably so as to be movable and may be removed from the susceptor holding frame. Thus the coating boat slides on the guide rails 16. All the parts of the guides of the coating boat preferably comprise quartz glass. The free space between the semi-conductor source material and the semi-conductor substrate discs to be coated is taken up during the reaction process by the transfer space 19.

Before the reaction gas which is introduced through the tube closure 8 can arrive in the region of this transfer space 19 it must at least partially pass through an initial chamber 10. This initial chamber 10 is preferably constructed in box shape and contains a further holder or susceptor 4. This susceptor 4 preferably lies in the plane of the susceptor 2 for the semi-conductor source material. The box-shaped initial chamber 10 is open with respect to the region 19 for the outlet of gas which is provided for the transfer space while the opposite endface 11 of the box 16 is closed and has only openings for one or more supply pipes 9.

This initial chamber 10 serves to produce partial pressure ratios at the beginning of the transfer space 19 as prevail over the entire longitudinal expanse of the transfer space. Thus it is ensured that in all of the semi-conductor substrate discs, the same deposition ratios prevail. In order to achieve this, semi-conductor source material 7 is arranged in the initial chamber. Thus for example it may be a question of semi-conductor source discs 7 placed on the holder 4 through which the reaction gas flows in laminar manner so that a large reaction surface is offered to the reaction gas.

In order to heat up the holder or susceptors 2, 3 and 4, radiation heaters are preferably used which are arranged outside the reaction tube. In the embodiment shown, the holders 2 and 3 are brought to the desired temperature by six radiation heaters in each case; three radiation heaters are provided for the holder 4 of the initial chamber. In each of the susceptors, which preferably comprise graphite, a temperature sensor is arranged by means of which the radiation heaters are controlled and thus the desired temperature of the susceptors is set, which temperature must be uniform over the longitudinal expanse of the susceptors. The radiation heating sources for the holders 2 to 4 are designated 13 to 15 respectively in FIG. 1. All the radiation heaters may be controlled independently of each other and separately.

When carrying out the epitaxial separating method, the susceptors 2 and 3 for example are equipped with silicon source discs or silicon substrate discs placed thereon. The susceptor 2 and the slightly smaller susceptor 4, which both carry semi-conductor source material, are heated with the aid of the radiation heaters 13 or 15 respectively to 1000° C. for example. The susceptor 3, below which the semi-conductor discs 6 to be coated are arranged, is on the contrary brought to a temperature of approximately 900° C. by means of the heaters 14. Then the reaction gas and possibly a carrier and a doping gas are introduced into the initial chamber 10 through the tube 9. Iodine for example is used as the reaction gas, while the carrier gas may be argon or nitrogen and, in certain cases, hydrogen. A mixture of gases is formed in the initial chamber 10, which mixture is composed of silicon tetraiodide (SiI$_4$), silicondiodide (SiI$_2$), I$_1$ and I$_2$. The composition and the partial pressure of the gas mixture depend on the temperature and the quantity of iodine available. This mixture of gas then passes out of the initial chamber 10 and reaches the transfer space 19 between the semi-conductor source discs 5 and the semi-conductor substrate discs 6 which are to be coated. In each case, an equilibrium system of partial pressures of the gas mixture is formed in the region of the source and in the region of the substrate discs, whereby a particle movement running in opposite directions takes place between the equilibrium systems because of the difference in temperature. For example silicon tetraiodide on a source material combines with silicon to form silicon diodide. This silicon diodide drifts across to the semi-conductor substrate discs because of the differences in partial pressure and is decomposed there in turn into silicon tetraiodide. The silicon is deposited on the substrate discs while the silicon tetraiodide in turn drifts to the source material and combines there again with silicon. In this way the semi-conductor source discs are etched away and the quantity of material worn off is epitaxially deposited on to the semi-conductor substrate discs as a monocrystalline semi-conductor layer. Since the spacing between the semi-conductor source discs 6 and the semi-conductor substrate discs 5 is very small, an optimum utilisation of the easily checked and controlled epitaxial process takes place.

It will be understood that the above description of the present invention is susceptible to various modification changes and adaptations.

What is claimed is:

1. A method of epitaxial deposition on semiconductor substrate discs by conversion of gaseous semiconductor compounds, said conversion taking place in a transfer space between a material source region and the semiconductor substrate discs, comprising in combination:
   arranging a plurality of coplanar semiconductor substrate discs in a common open region of reaction tube having a gas inlet and a gas outlet at its respective ends with said substrate discs being arranged adjacent one another in a plane extending substantially parallel to the longitudinal axis of the reaction tube;
   providing a source of semiconductor material opposite each of said substrate discs in said common open region of the reaction tube with said source material being disposed in a plane which is parallel to and vertically displaced from said plane of said semiconductor substrate discs and with the spacing between said planes being small as compared to the length of the reaction tube;
   separately controlling and maintaining the temperature in said planes at different desired temperatures;
   providing an additional source of semiconductor material in an initial chamber disposed in said reaction tube adjacent its gas inlet;
   maintaining said additional source of semiconductor material at a desired temperature; and
   flowing a reaction gas through said initial chamber and then through said common portion of the reaction tube to provide a respective partial pressure equilibrium system of the gaseous medium produced around said substrate discs and said source material, whereby said two equilibrium systems come into interaction across said transfer space between said planes while eroding semiconductor material from the source and depositing semiconductor material on the substrate discs.

2. A method as defined in claim 1 wherein said plane of said source of semiconductor material is below said plane of said semiconductor substrate discs.

3. A method as defined in claim 1 further comprising flowing said reaction gas through said additional semiconductor source material in said initial chamber in a laminar manner.

4. A method as defined in claim 3 wherein said additional semiconductor source material in said initial chamber comprises a plurality of disc-shaped semiconductor bodies; and further comprising arranging said disk shaped semiconductor bodies in said initial chamber so that their surfaces are substantially parallel to the direction of flow of said reaction gas.

5. A method as defined in claim 1, 3 or 4 further comprising adding a carrier gas and/or a doping gas to said reaction gas.

* * * * *